United States Patent
Law et al.

[11] Patent Number: 5,861,197
[45] Date of Patent: *Jan. 19, 1999

[54] DEPOSITION OF HIGH QUALITY CONFORMAL SILICON OXIDE THIN FILMS ON GLASS SUBSTRATES

[75] Inventors: Kam Law, Union City; Robert Robertson, Palo Alto; Guofu Jeff Feng, San Jose, all of Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 740,012

[22] Filed: Oct. 23, 1996

Related U.S. Application Data

[63] Continuation of Ser. No. 165,052, Dec. 9, 1993, abandoned.

[51] Int. Cl.$^6$ .............................. B05D 3/06; C23C 16/40
[52] U.S. Cl. .................... 427/579; 427/578; 427/573; 427/574; 427/109
[58] Field of Search .................................. 427/579, 578, 427/573, 574, 109; 438/788

[56] References Cited

U.S. PATENT DOCUMENTS

| | | | |
|---|---|---|---|
| 4,668,365 | 5/1987 | Foster et al. .................. | 204/192.23 |
| 4,854,263 | 8/1989 | Chang et al. .................. | 118/715 |
| 4,892,753 | 1/1990 | Wang et al. .................. | 427/38 |
| 4,987,856 | 1/1991 | Hey et al. .................. | 118/715 |

FOREIGN PATENT DOCUMENTS 5-47750  2/1993  Japan .

OTHER PUBLICATIONS

Batey, et al., "Low temperature deposition of high quality silicon dioxide by plasma enhanced chemical vapor deposition", J. Appl. Phys. 60 (9), Nov. 1986, pp. 3136–3145.

Pande, et al., High mobility n–channel metal oxide semiconductor field effect transistors based on SiO2—InP interface, J. Appl. Phys. 55 (8), Apr. 1984, pp. 3109–3114.

*Primary Examiner*—Roy V. King
*Attorney, Agent, or Firm*—William J. Egan, III

[57] ABSTRACT

A plasma enhanced chemical vapor deposition process for depositing conformal silicon oxide thin films useful to make thin film transistors which have stable electrical properties and low charge centers onto a substrate comprising flowing a precursor gas mixture of silane and nitrous oxide, the latter at a high rate, at a pressure of at least about 0.8 torr and a temperature of from about 250° to 350° C. The effective volume of the reaction region between the gas manifold inlet and the substrate during processing is kept small.

2 Claims, 2 Drawing Sheets

DEPOSITION OF HIGH QUALITY CONFORMAL SILICON OXIDE THIN FILMS ON GLASS SUBSTRATES

This is a continuation of application Ser. No. 08/165,052, filed Dec. 9, 1993, now abandoned.

This invention relates to the deposition of silicon oxide thin films onto large area substrates. More particularly, this invention relates to the deposition of conformal thin films of silicon oxide which have low surface charge.

BACKGROUND OF THE INVENTION

In the manufacture of liquid crystal cells, two glass plates are joined together with a layer of a liquid crystal material sandwiched between them. The glass substrates have conductive films thereon (at least one of which is transparent, such as an ITO film) that can be connected to a source of power to change the orientation of the liquid crystal material. Various areas of the liquid crystal cell can be accessed by proper patterning of the conductive films. More recently, thin film transistors (hereinafter TFT) have been used to separately address areas of the liquid crystal cell at fast rates. Such liquid crystal cells are useful for active matrix displays such as TV and computer monitors.

As the requirements for resolution of liquid crystal monitors has increased, it has become desirable to separately address a plurality of areas of the liquid crystal cell, called pixels. Since about one million pixels are present in modern displays, at least the same number of transistors must be formed on the glass plates so that each pixel can be separately addressed.

Different types of thin film transistors are in current use; two common types are the inverted amorphous silicon TFT and a polysilicon TFT. The amorphous silicon TFT requires deposition of a gate dielectric layer over a patterned gate material with an amorphous silicon layer thereover. The gate dielectric layer can be a single layer of one material, such as silicon nitride, or it can be made of two layers of different materials. In the case when two layers are employed, the bottom layer is typically a metal oxide or silicon oxide, and the top layer, adjacent to the amorphous silicon layer, is typically silicon nitride. Metal contacts are deposited over the amorphous silicon film, which can have a thin layer of doped silicon thereover to improve contact between the amorphous silicon and the overlying aluminum contacts.

The polysilicon TFT has a layer of polysilicon as the active semiconductor material, which is deposited over a thick silicon oxide underlayer. On top of the polysilicon there is a thin layer of silicon oxide for the gate dielectric, and another layer for the gate contact. Source and drain contacts are formed in contact with the polysilicon layer.

The silicon oxide film must be of high quality when it is used as the gate dielectric, either in the inverted amorphous silicon TFT or the polysilicon TFT. The silicon oxide must be conformal and free of pinholes or voids in order to prevent leakage current between the gate contact and the active semiconductor material. In addition, the silicon oxide must have a high resistance to electrical breakdown, must be electrically stable and must have a minimum amount of fixed charge or charge trapping sites in order for the transistor electrical characteristics to be stable and reliable.

Silicon oxide is deposited also directly on a bare glass substrate as an underlayer to act as a barrier between the glass substrate and the transistor for inverted amorphous silicon TFTs, polysilicon TFTs and top-gate amorphous silicon TFTs. In this application, the requirements for film quality of silicon oxide are similar to the requirements for silicon oxide used as a gate dielectric, and there is an additional requirement that the film act as a barrier to prevent the diffusion of chemical contaminants from the glass substrate to the transistor.

An additional application for silicon oxide is as an electrically insulating layer in polysilicon TFTs. The requirements for this application are similar to the requirements for silicon oxide used as a gate dielectric layer, though perhaps less stringent.

Because of the large size and weight of glass substrates, which can be for example about 350×450×1.1 mm in size, generally large reaction chambers are required for deposition of thin films thereon, and large and often slow transfer equipment is needed to transfer the substrates from one reaction chamber to another for sequential deposition of the thin films for thin film transistor manufacture.

However, recently a vacuum system has been developed having multiple chambers that can bring a plurality of substrates to vacuum, heat them batch wise to CVD temperatures, transfer them singly to specially designed CVD or other processing chambers that can deposit thin films of, inter alia, silicon oxide, and transfer them back to a cooling chamber, all without leaving a vacuum environment. However, in order to maximize the efficiency of such a system, the processing time for each substrate must be kept in a range of about 30 to 120 seconds. Thus thick silicon oxide films must be deposited at high deposition rates, while thin silicon oxide films can be deposited at lower deposition rates.

Thus it would be highly desirable to be able to deposit conformal films of electrically stable silicon oxide having a low charge by chemical vapor deposition over a range of deposition rates.

SUMMARY OF THE INVENTION

We have found that conformal thin films of electrically stable silicon oxide can be deposited at preselected deposition rates by chemical vapor deposition of silane ($SiH_4$) and nitrous oxide ($N_2O$) using a high flow rate of nitrous oxide, and comparatively high pressures in a vacuum system as described above. The silicon oxide films are electrically stable and form excellent thin film transistor devices on large glass or semiconductor substrates.

DETAILED DESCRIPTION OF THE INVENTION

We have found that we can deposit electrically stable, conformal silicon oxide thin films over large area glass substrates having preformed patterns thereon by CVD processing at variable deposition rates. The variable deposition rates are achieved by optimizing the process parameters for a particular deposition rate, which parameters include the pressure, RF power, gas flows, electrode/gas manifold spacing and substrate temperature. A high flow rate of $N_2O$ improves the electrical characteristics and stability of the resultant silicon oxide film. It is believed that the $N_2O$ reduces the fixed charge, charge trapping sites and certain undesirable chemical constituents, such as water, -OH radicals, and hydrogen in the form of N-H or Si-H bonds.

U.S. Pat. No. 4,892,753 to Wang et al, incorporated herein by reference, describes a plasma enhanced CVD reactor having features suitable for carrying out the present CVD process. Although the reactor of this reference is described in terms of depositing passive silicon oxide on semiconductor wafers, suitable adjustments of size will accommodate the present large area glass substrates.

The reactor will be further described with reference to FIG. 1.

Figure 1:
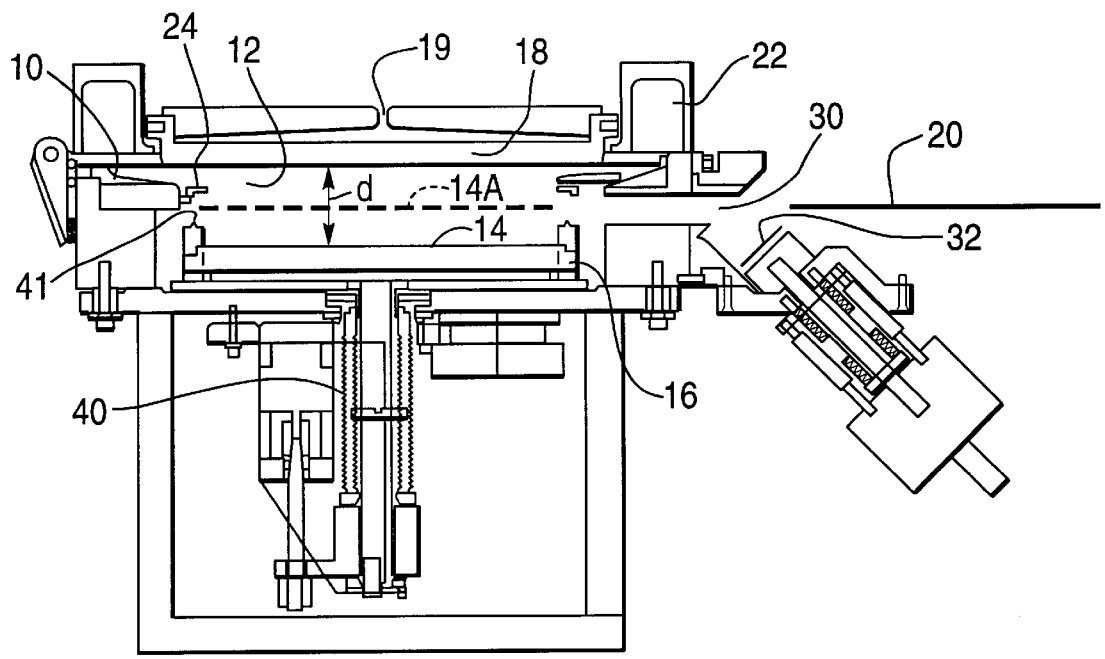
FIG. 1 is a cross sectional view of a CVD reactor useful for deposition of silicon oxide thin films onto large area glass plates.

FIG. 1 is a cross sectional view of a vacuum chamber 10, typically made of aluminum, that has a reaction region 12. A substrate 14 is supported on a suitable support or susceptor 16 that can be heated, as by a resistive heater embedded in the susceptor. Above the substrate 14 is a gas manifold plate 18 which supplies the precursor reaction gases, carrier gases, if any, and purge gases from a gas inlet 19 to the reaction region 12. The spacing -d- between the substrate 14 and the gas manifold 18 is adjustable by an elevator assembly 40. The ability to adjust the spacing -d- enables the process to be optimized over a wide range of conditions, and particularly produces the desired electrical characteristics for the silicon oxide films. The spacing -d- between the substrate 14 and the gas manifold plate 18 is preferably about 400 to about 1500 mils (1/1000 inch).

The elevator assembly 40 has a dual function. When a substrate 14 is transferred into the chamber 10 by means of a substrate support arm 20 operated by a robot in an adjacent chamber (not shown), the position of the substrate 14 in the chamber initially is shown by the dotted line 14A. At that time the lift pins 41 are raised to support the substrate. The elevator assembly 40 then raises the susceptor 16 and the substrate 14 to the processing position. A closable opening 30 is opened to allow entry and exit of the substrate 14 by the robot support arm 20. During processing, the closable opening 30 is closed by means of a piston driven slit valve 32.

The gas manifold plate 18 is a plate having a plurality of openings therethrough uniformly distributed over the plate 18. A typical manifold plate 18 useful herein has about 10,000 openings in the plate over an area about the same size as the substrate 14.

The gas manifold plate 18 is part of a gas distribution system that flows the process gases uniformly across the substrate 14 and radially outwardly to the edges of the substrate and beyond, where they are removed by exhaust port 22. A shield or shadowframe 24 prevents deposition onto the edges of the substrate 14.

The temperature of the gas manifold 18 is regulated so as to minimize deposition of the solid products of the reaction onto the gas manifold 18.

An RF power supply and matching network (not shown) create and sustain a plasma of the process gases from the precursor gases in the reaction region 12. Preferably high frequency RF power of 13.56 MHz is employed, but this is not critical and lower frequencies can be used. Further, the gas manifold plate 18 is RF driven, while the susceptor or substrate support 16 is grounded. The walls of the chamber 10 can be protected with ceramic. This design allows a high degree of plasma confinement between the gas manifold 18 and the support 16, thereby increasing the concentration of reactive species in the reaction region 12 and the deposition rate of the subject thin films.

By maintaining the spacing -d- between the gas manifold plate 18 and the substrate 14 relatively small, the chamber 10 itself can be made smaller and the deposition process is more controllable. Further, the small volume of the reaction region 12 permits rapid changes in the gas composition fed to the reaction region 12, and reactant gases and purge gases can be rapidly removed through the exhaust port 22 between sequential depositions.

Silicon oxide thin films are deposited in accordance with the invention using silane (100–400 sccm) and nitrous oxide (6000–10,000 sccm) as the precursor gases. Silicon oxide can be deposited conformally over patterned substrates at variable rates under preselected conditions to a thickness suitably from about 300–4000 angstroms.

The quality of the silicon oxide film is measured by various factors including refractive index, stress, wet etch rate and the roughness of the surface. The refractive index is a measure of the chemical composition of the film; a refractive index of about 1.48 is indicative of a silicon-rich, non-stoichiometric film, whereas a refractive index of about 1.43 indicates that the silicon oxide has a low density. A refractive index of about 1.45 +/–0.01 is desirable for the present application. IR absorption analysis reveals that the hydrogen level is quite low in the present films; high hydrogen levels degrade the electrical stability of the films and has an adverse impact on thin film transistors made therefrom.

The temperature of the substrates, e.g., glass plates, must be high enough for efficient deposition but must be maintained below about 450° C. when large glass substrates may warp. In general a deposition temperature of from about 250°–350° C. is maintained for the present silicon oxide thin film deposition.

The pressure of the present deposition process is maintained at a somewhat higher level than prior art processes, which we believe contributes to the high deposition rates achieved herein. In general, the pressure in the reaction chamber should be maintained above about 0.8 Torr, and is preferably maintained at about 2.0 Torr, but higher pressures can be used. In any event, thin films of silicon oxide deposited at the above temperatures and pressures, and in the above-described variable spacing CVD reactor, results in deposition rates of up to 5000 angstroms per minute, as contrasted to deposition rates of about 230 angstroms per minute for prior art processes and reactors for thin film transistor applications.

The present invention will be further illustrated in the following examples, but the invention is not to be limited to the details described herein.

EXAMPLE 1

This example demonstrates deposition of a high quality silicon oxide film at a comparatively low deposition rate.

A glass substrate having a preselected pattern of polysilicon pads deposited thereon in an array was brought under vacuum and into the CVD chamber as described hereinabove. A silicon oxide film was deposited onto the substrate under the following conditions:

| SiH$_4$ | 200 sccm |
|---|---|
| N$_2$O | 6000 sccm |
| Power | 500 Watts |
| Pressure | 2 Torr |
| Spacing | 1462 mils |
| Substrate Temperature | 340° C. |

The silicon oxide deposition rate was 653 angstroms per minute. The film had a refractive index of 1.458 and the surface roughness variation was 1.45 nm. The wet etch rate was 2319 angstroms per minute in 6:1 buffered oxide etch and the stress −0.9 E9 dynes/cm$^2$. IR absorption analysis showed no detectable N-H was present in the film.

EXAMPLE 2

This example illustrates the deposition of high quality silicon oxide films at an intermediate deposition rate. The reaction conditions are summarized below:

| SiH$_4$ | 150 sccm |
|---|---|
| N$_2$O | 6000 sccm |
| Power | 800 Watts |
| Pressure | 1.5 Torr |
| Spacing | 710 mils |
| Substrate Temperature | 350° C. |

The deposition rate under these conditions was 2800 angstroms per minute. The refractive index was 1.458 and the wet etch rate in 6:1 buffered oxide etch was 2317 angstroms per minute. The film had low stress of −1.9 E9 dynes/cm$^2$ and low H-content. No N-H was detectable in the IR absorption spectrum.

EXAMPLE 3

This example illustrates deposition of high quality silicon oxide films at a high deposition rate.

The process of Example 1 was followed except that the spacing between the gas manifold plate and the substrate support was reduced. This example was run under the following conditions:

| SiH$_4$ | 300 sccm |
|---|---|
| N$_2$O | 7000 sccm |
| Power | 700 Watts |
| Pressure | 1.5 Torr |
| Spacing | 710 mils |
| Substrate Temperature | 300° C. |

The deposition rate under these conditions was 4854 angstroms per minute. The refractive index of the film was 1.469 and the wet etch rate was 1722 angstroms per minute. The film had a low stress, −1.2 E9 dynes/cm$^2$, and a low N-H content.

Figure 2:
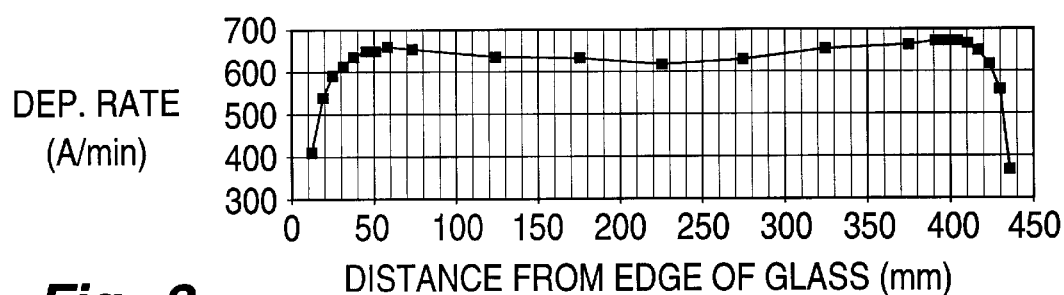
FIG. 2 is a graph of deposition rate versus distance along a substrate of a silicon oxide film deposited at a low deposition rate.
Figure 3:
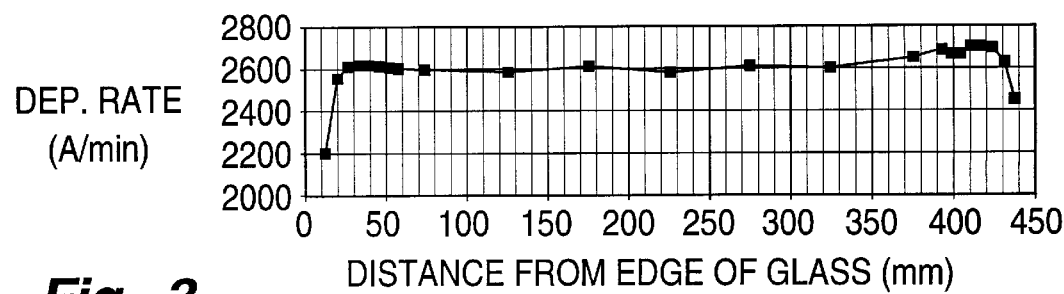
FIG. 3 is a graph of deposition rate versus distance along a substrate of a silicon oxide film deposited at a high deposition rate.

The deposition rates for the silicon oxide films is strongly dependent upon the spacing defining the processing region. FIGS. 2 and 3 are graphs illustrating the deposition rates, in angstroms per minute, for depositing passive silicon oxide on large glass substrates, 350×450×1.1 mm, for two processes that are identical except for spacing. FIG. 2 shows the variation in deposition rate using a spacing of 1462 mils (Example 1) as a function of the distance from the edge of the glass plate, and FIG. 3 shows the variation in deposition rate using a spacing of 710 mils (Example 3) as a function of the distance from the edge of the glass plate. A comparison of FIGS. 2 and 3 show that the deposition rate is more controllable and more uniform when the spacing is reduced, even though the deposition rate is much higher at reduced spacing. This result was unexpected.

The deposition rate can also be varied by optimizing the deposition pressure, flow rates of silane and/or nitrous oxide, the power and the temperature of the substrate.

Figure 4:
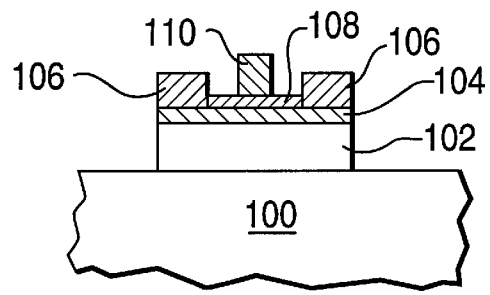
FIG. 4 is a cross sectional view of a polysilicon thin film transistor made with a silicon oxide film deposited in accordance with the present invention.

The process of Example 1 was used to deposit silicon oxide for the gate dielectric of a polysilicon thin film transistor. As shown in FIG. 4, this device is built on a glass substrate 100 by first depositing a silicon oxide underlayer 102 and a polysilicon layer 104 as the active semiconductor materials. Source and drain contacts 106 are made to be in direct contact with the polysilicon layer 304. The gate dielectric 108, made of silicon oxide, is deposited between the polysilicon layer 104 and the polysilicon gate contact 110. The transistor electrical characteristics of devices made with silicon oxide deposited by the process illustrated in Example 1 met all performance requirements. This evaluation demonstrated that the films had low fixed charge or trapping sites, had high breakdown voltages and had few pinholes.

Figure 5:
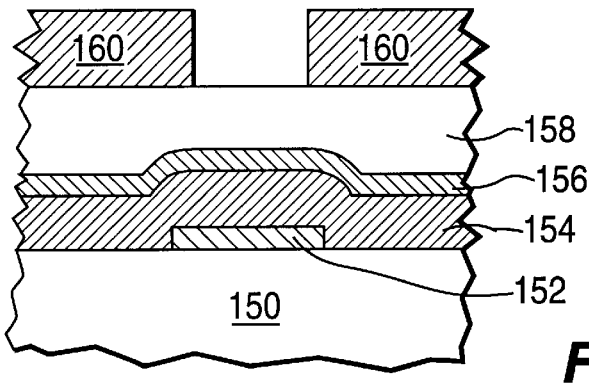
FIG. 5 is a cross sectional view of a thin film transistor made with a silicon oxide film deposited in accordance with the present invention.

The process of Example 2 was employed to produce a glass panel of FIG. 5. FIG. 5 illustrates a glass panel 150 having a first patterned gate metal layer 152 thereon, a silicon oxide layer 154 thereover deposited in accordance with the present invention, a silicon nitride layer 156 thereover and a layer of amorphous silicon 158. Preferably the silicon nitride layer 156 is deposited in accordance with copending application of Kam Law et al, "METHOD OF DEPOSITING SILICON NITRIDE THIN FILMS ONTO LARGE AREA GLASS SUBSTRATES BY CHEMICAL VAPOR DEPOSITION AT HIGH DEPOSITION RATES", Ser. No. 08/010,109 filed Jan. 28, 1993, now abandoned, and the amorphous silicon layer 158 is deposited in accordance with the process described in copending application of Kam Law et al, "METHOD FOR DEPOSITING AMORPHOUS SILICON THIN FILMS ONTO LARGE AREA GLASS SUBSTRATES BY CHEMICAL VAPOR DEPOSITION AT HIGH DEPOSITION RATES", Ser. No. 08/010,118 filed Jan. 28, 1993, now abandoned both incorporated herein by reference. The resultant panel can be formed into an array of thin film transistors by depositing and patterning a conductive film 160, as of aluminum, over the amorphous silicon layer 158 to form source and drain electrodes in known manner.

The process of Example 3 was employed to deposit silicon oxide as an underlayer, or barrier layer, in a top-gate amorphous silicon TFT. The transistor electrical characteristics met the performance requirements.

The success of these transistor device evaluations demonstrate that high quality silicon oxide films can be produced with a wide range of deposition rates for a variety of device applications.

The above described CVD process can be utilized in systems known for multistep processing of semiconductor substrates, such as is disclosed by Maydan et al in U.S. Pat. No. 4,951,601 or in vacuum systems designed to deposit multiple layers onto large glass substrates for the manufacture of thin film transistors, as described in copending application of Norman Turner et al entitled "VACUUM PROCESSING APPARATUS HAVING IMPROVED THROUGHPUT", Ser. No. 08/010,684 filed Jan. 28, 1993, now abandoned, and "METHOD OF HEATING AND COOLING LARGE AREA GLASS PLATES AND APPARATUS THEREFOR", Ser. No. 08/010,683 filed Jan. 28, 1993, now U.S. Pat. No. 5,607,009, also incorporated by reference herein. This vacuum system is described below with reference to FIG. 6.

Figure 6:
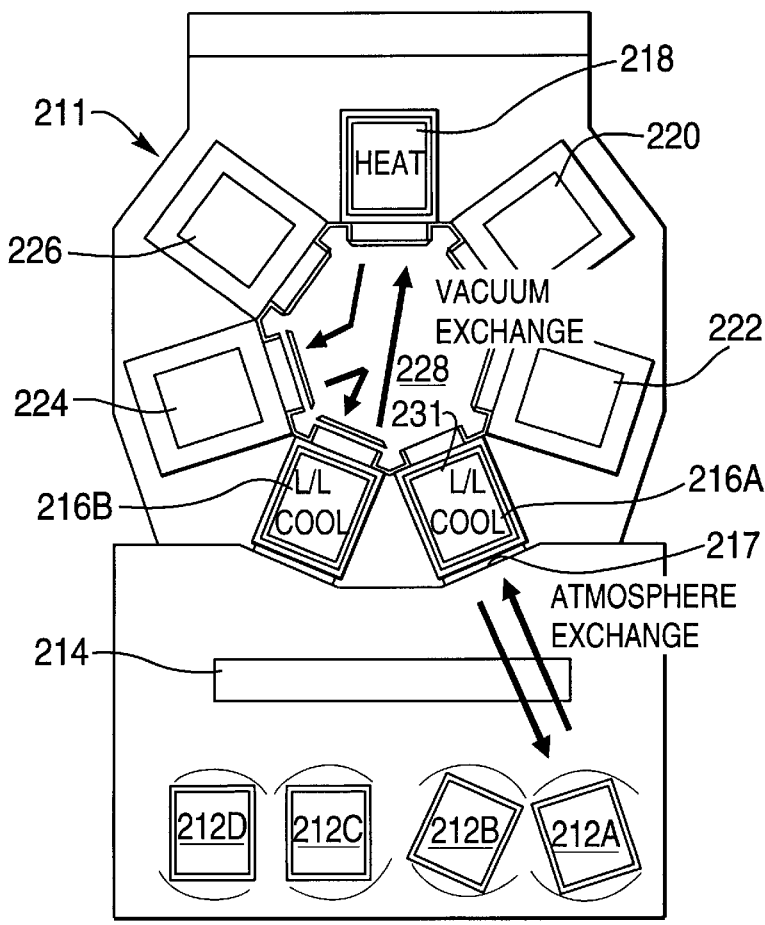
FIG. 6 is a plan view of a vacuum system for processing glass substrates including the CVD reactor of FIG. 1.

FIG. 6 is a plan view of a vacuum system for deposition of multiple films onto large glass substrates.

Referring now to FIG. 6, a deposition system 211 comprises a series of chambers for deposition of a plurality of thin films on large glass substrates. Cassettes 212A, 212B, 212C and 212D contain a plurality of shelves for the storage of large glass substrates therein. A robot 214 is used to carry the glass substrates one at a time from the cassettes 212 into one of two combination cool and load lock chambers 216A and 216B through a closable opening 217 to atmosphere. The system 211 also includes a heating chamber 218 to bring the glass substrates up to CVD temperatures. A series of four CVD chambers 220, 222, 224 and 226, together with the two cooling/load lock chambers 216 and the heating chamber 218 define between them a vacuum transfer chamber 228. The cooling/load lock chambers 216A and 216B and the heating chamber 218 hold cassettes which are mounted on an elevator assembly (not shown) that can be indexed vertically. These heating and cooling cassettes have thermally conductive shelves therein for supporting the glass substrates while they are being heated or cooled.

After the robot 214 transfers a glass substrate from a cassette 212 into a cassette of the cooling/load lock chamber cassette 216A, the elevator assembly raises (or lowers) the cassette by the height of one shelf, when another glass substrate is transferred to the cassette of the cooling chamber 216A by the robot 214. When all of the shelves in the cassette of the chamber 216A have been filled, the closable opening 217 is closed and the chamber 216A is evacuated. When the desired pressure is reached, a closable opening 231 adjacent the transfer chamber 228 is opened. A transfer robot (not shown) transfers all of the glass substrates from the cooling/load lock chamber 216A to a cassette in the heating chamber 218, where the glass substrates are heated to near deposition temperatures. The cassettes in the heating chamber 218 and the cooling chamber 216A are raised or lowered after each transfer to present a different shelf to the transfer robot in the transfer chamber 228.

When the glass substrates have reached deposition temperature, the transfer robot transfers the glass plate to one or more of the CVD chambers 220, 222, 224 or 226 sequentially, in a preselected order. For example a film of silicon oxide may be deposited in the first CVD chamber 220, a film of silicon nitride may be deposited in the second CVD chamber 222, a film of amorphous silicon may be deposited in the third CVD chamber 224 and a film of doped amorphous silicon may be deposited in the fourth CVD chamber 226. When all of the preselected depositions have been made, the transfer robot transfers the processed glass substrates back to the cassette of the cooling/load lock chamber 216A. The closable opening 231 is closed when all of the shelves in the cooling/load lock chamber 216A have been filled. Concurrently, the robot 214 is transferring another batch of glass substrates from a different cassette, e.g., 212C, to a cassette in the cooling/load lock chamber 216B and evacuating the chamber 216B when loading is complete.

When all of the processed glass substrates in the cooling/load lock chamber cassette 216A have been cooled to below about 100° C., the chamber 216A is brought to ambient pressure, the closable opening 217 is opened and the robot 214 unloads the now processed glass substrates back to one of the cassettes 212.

Thus the system 211 is built for continuous operation. The combination of batch heating and cooling of glass substrates, an operation that takes a relatively long period of time, e.g., several minutes, and single substrate CVD processing, which takes a comparatively short time, e.g., about one minute, maximizes the throughput and efficiency of the system 211.

Although the invention has been described in accordance with certain embodiments and examples, the invention is not meant to be limited thereto. The CVD process herein can be carried out using other CVD chambers, adjusting the gas flow rates, pressure, temperature and processing spacing so as to obtain high quality silicon oxide films at practical and flexible deposition rates. The invention is meant to be limited only by the scope of the appended claims.

We claim:

1. A plasma-enhanced chemical vapor deposition process for depositing silicon oxides on a glass substrate in a processing chamber, comprising the steps of:

heating a glass substrate in the process chamber to a temperature of between about 250° and 350° C.;

introducing a precursor gas including silane and nitrous oxide through a gas inlet manifold, the precursor gas being introduced at a pressure of at least about 0.8 torr, the flow of silane through the gas inlet manifold being between about 100 and 400 sccm, the flow of nitrous oxide through the gas inlet manifold being between about 6000 and 10,000 sccm, and the distance between the gas inlet manifold and the substrate being between about 400 and 1500 mils; and generating a plasma of said precursor gas using a power density of less than about 0.3 and 0.5 watts per square centimeter to form an active conformal layer of silicon oxide having an index of refraction of between about 1.44 and 1.46.

2. A plasma-enhanced chemical vapor deposition process for depositing silicon oxides on a glass substrate in a process chamber, comprising the steps of:

heating a glass substrate in the process chamber to a temperature of between about 250° and 350° C.;

introducing a precursor gas including silane and nitrous oxide into the process chamber through a gas inlet manifold, the precursor gas being introduced at a pressure of at least about 0.8 torr, the flow of silane through the gas inlet manifold being between about 0.06 and 0.24 sccm per square centimeter of substrate area, the flow of nitrous oxide through the gas inlet manifold being between about 3.75 and 6.25 sccm per square centimeter of substrate area, and the distance between the gas inlet manifold and the substrate being between about 400 and 1500 mils;

initiating a plasma of said precursor gas using a power density of less than about 0.5 watts per square centimeter; and varying the precursor gas flow rates of silane and nitrous oxide introduced into the process chamber, the substrate temperature, and the plasma-generating power density to form an active conformal layer of silicon oxide having an index of refraction of between about 1.44 and 1.46.

* * * * *